United States Patent [19]

Izumita et al.

[11] Patent Number: 4,764,927
[45] Date of Patent: Aug. 16, 1988

[54] CODE ERROR CORRECTING METHOD

[75] Inventors: Morishi Izumita, Inagi; Seiichi Mita, Kanagawa; Nobukazu Doi, Hachioji; Fuyuki Inui; Akira Saito, both of Katsuta; Mamoru Kaneko, Hachioji, all of Japan

[73] Assignees: Hitachi, Ltd.; Hitachi Video Eng. Inc., both of Tokyo, Japan

[21] Appl. No.: 909,336

[22] Filed: Sep. 19, 1986

[30] Foreign Application Priority Data

Sep. 30, 1985 [JP] Japan .................................. 60-214720

[51] Int. Cl.$^4$ .............................................. G06F 11/10
[52] U.S. Cl. ......................................... 371/39; 371/50; 371/41
[58] Field of Search ....................... 371/39, 41, 31, 50, 371/40, 37, 38

[56] References Cited

U.S. PATENT DOCUMENTS

| 4,517,600 | 5/1985 | Reitmeier | 371/31 X |
| 4,546,474 | 10/1985 | Sako | 371/39 |
| 4,592,054 | 5/1986 | Namekawa | 371/39 |
| 4,644,544 | 2/1987 | Furuya | 371/40 X |
| 4,653,052 | 3/1987 | Doi | 371/39 |

Primary Examiner—Jerry Smith
Assistant Examiner—Robert W. Beausoliel
Attorney, Agent, or Firm—Antonelli, Terry & Wands

[57] ABSTRACT

An error detection and/or correction is achieved in the horizontal direction in a block and then an error state is determined by use of an error correction in the vertical direction; furthermore, the correcting system is changed over according to the result of the determination.

5 Claims, 6 Drawing Sheets

CODE ERROR CORRECTING METHOD

BACKGROUND OF THE INVENTION

The present invention relates to a decoding method or a code error correcting method in an apparatus in which digital signals are recorded and reproduced, and in particular, to a code error correcting method suitable for improving the decoding efficiency in the double-encoding code system.

In an apparatus for recording and reproducing digital signals, error correction codes are commonly used to increase the system reliability. Such codes have been applied to, for example, a digital audio disk (CD) and a digital VTR in which audio and video signals are digitized for the recording and, reproducing operations. In such an apparatus, due to causes such as a dropout, a slight random error and a consective code error (to be referred to as a burst error herebelow) take place. To an apparatus in which these types of code errors may occur at the same time, the double-encoding code system including error correction codes arranged in a two-dimensional configuration is applied in many cases. In the double-encoding code system, the error correction can be achieved in two stages when decoding the codes, which realizes a code configuration having a very high efficiency with respect to a complex error.

Prior-art techniques for correcting code errors have been described, for examples, in the JP-A-No. 57-24143 and JP-A-No. 57-10557.

FIG. 4 is a schematic diagram showing an example of an arrangement including data 11 and first parity symbols 12A and second parity symbols 12B in the double-encoding code system. The first parity symbols 12A comprise two parity symbols A10 and A20 for a group of ten symbols vertically arranged as 00, 10, 20, ---, 80, and 90, where each symbol is constituted from eight bits. The second parity symbols 12B include two parity symbols B00 and B01 for a group of ten horizontally arranged symbols 00, 01, 02, ---, and 09. As the code, the Reed-Solomon code defined on a Galois field GF ($2^8$) may be used, for example. The Galois field is a field having a finite number of symbols. For example, GF ($2^8$) indicates that the field has symbols of which number is $2^8 - 1 = 255$. Further each symbol consists of eight bits. When this code is applied to the parity in the code configuration of FIG. 4, there is provided a function to correct an error of at most a symbol in the vertical or horizontal direction.

When recording and reproducing (or transmitting) the data in such an arrangement, data of the first row 00, 01, ---, 09, B00, B01 constituting a code word is first recorded for reproduction, and the subsequent data are similarly recorded as a code word of the second row, a code word of the third row, ---, and a code word of the 12th row in this order. That is, a code word here indicates the symbols constituting a row or a column of FIG. 4.

A random error occurs in an arbitrary symbol, whereas a burst error consecutively takes place in the horizontal direction (along the row). FIG. 5 shows an example of such a burst error. In this case, the function to correct errors can be further improved by specifying the row in which the error has occurred. For example, in the case of FIG. 5, if the number of rows in which errors have occurred (the number of erasure flags) is at most two, all errors can be corrected by use of the first parity 2A (in the vertical direction). The number is limited to 2 because the number of parity symbols A1j and A2j of the vertical parity 2A is two. This operation is called an erasure correction. The erasure correction has a very high capability to correct burst errors; however, when the number of random errors increases, there arises a problem that the error correcting capability is rapidly lowered. FIG. 6 is a schematic diagram illustrating an example including a greater number of random errors. In this case, since the number of rows in which errors have occurred, namely, the number of erasure flags is three or more, the erasure correction is impossible.

On the other hand, in a random error correction, only the vertical parity may be used to correct the 1-symbol error. Namely, in a case where only the random errors of FIG. 6 have occurred, the 1-symbol error takes place in the vertical direction, and hence all errors can be corrected. However, for such a long burst error as shown in FIG. 5, a 2-symbol error occurs in the vertical direction and thus the error correction is impossible.

As described above, although there can be considered several error correcting systems for decoding the codes of the double-encoding code system, these correcting systems are respectively attended with advantages and disadvantages.

When the number of code errors increases due to deterioration of the condition of the apparatus and medium, there may result error problems that cannot be detected or the correct data is mistakenly subjected to an error correction (mis-correction). To overcome these problems, a method is applied to such apparatus in which code errors beyond the correcting capability of the apparatus are detected so as to be replaced (concealed) with signals having a strong correlation (for example, image data contained in the preceeding field), which can reduce the probability of the mis-correction and the error detection failure. However, when the number of symbols to be replaced is increased, there exist problems such that the signal deterioration occurs in a portion where the screen changes (having no correlation).

SUMMARY OF THE INVENTION

It is therefore an object of the present invention to provide a code error detecting method which enables an efficient code error correction when decoding digital data or symbols particulary in the double-encoding code system.

According to the present invention, a horizontal error detection and/or correction is first accomplished in a block, and then a check is performed to determine the error state by using the result of the vertical error correction; thereafter, the correction system is changed over according to the result of the check. Here, a block is obtained by arbitrarily dividing a screen and by adding the horizontal and vertical parity symbols thereto.

Referring now to FIG. 1, a description will be given of the principle of the code error correcting method according to the present invention. After the error correction/detection is conducted in the horizontal direction, the vertical error detection is achieved by use of the vertical parity. Depending on the result of the vertical error detection, the columns (lines in the vertical direction) thus detected are checked to determine whether or not the numbers assigned thereto are successive. If at least several numbers are consecutive, it is assumed that the probability of an occurrence of a burst error is quite high and the erasure correction is performed in the vertical direction. If the numbers associated with the detected errors are not successive, namely, the numbers are randomly distributed, a random error is assumed to have occurred and the random error correction is effected in the vertical direction (for a 1-symbol correction).

According to the method described above, an efficient code error correction can be accomplised in cases of both random and burst errors.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

A description will be given of an embodiment of the preferred embodiment according to the present invention.

Figure 1:
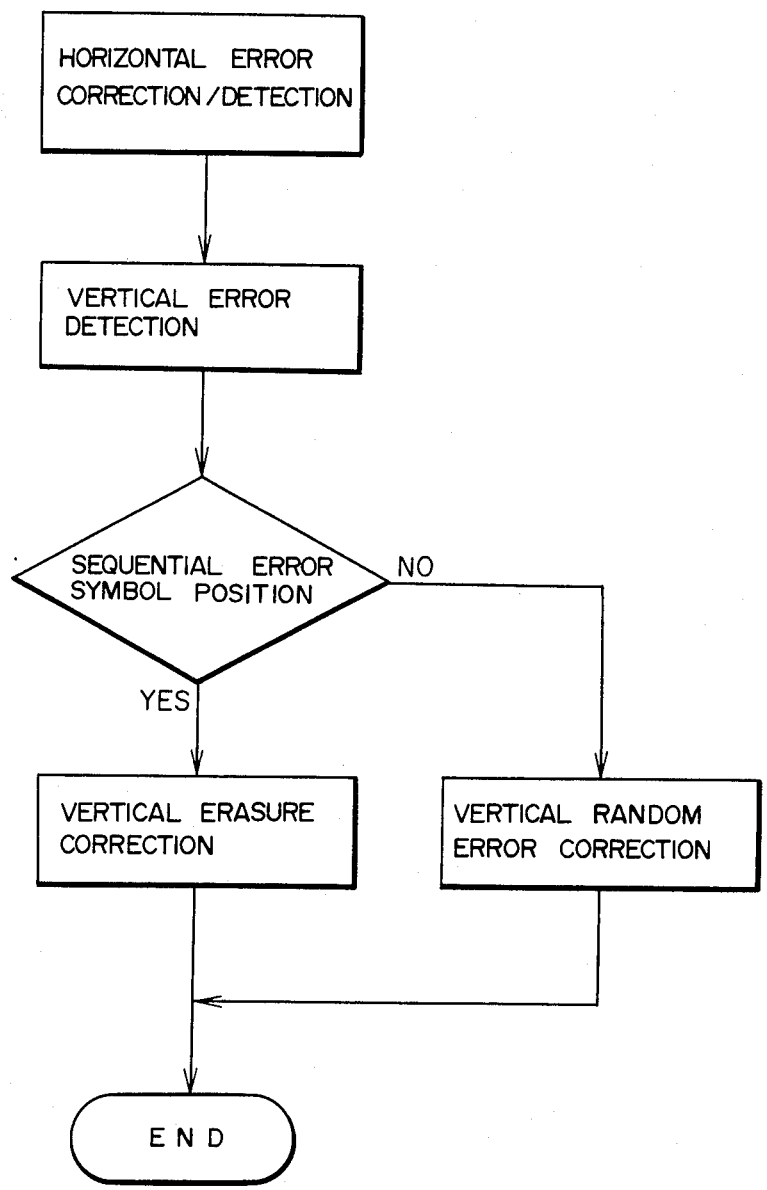
FIG. 1 is an explanatory diagram for explaining the principle of the code error correcting method according to the present invention.
Figure 2:
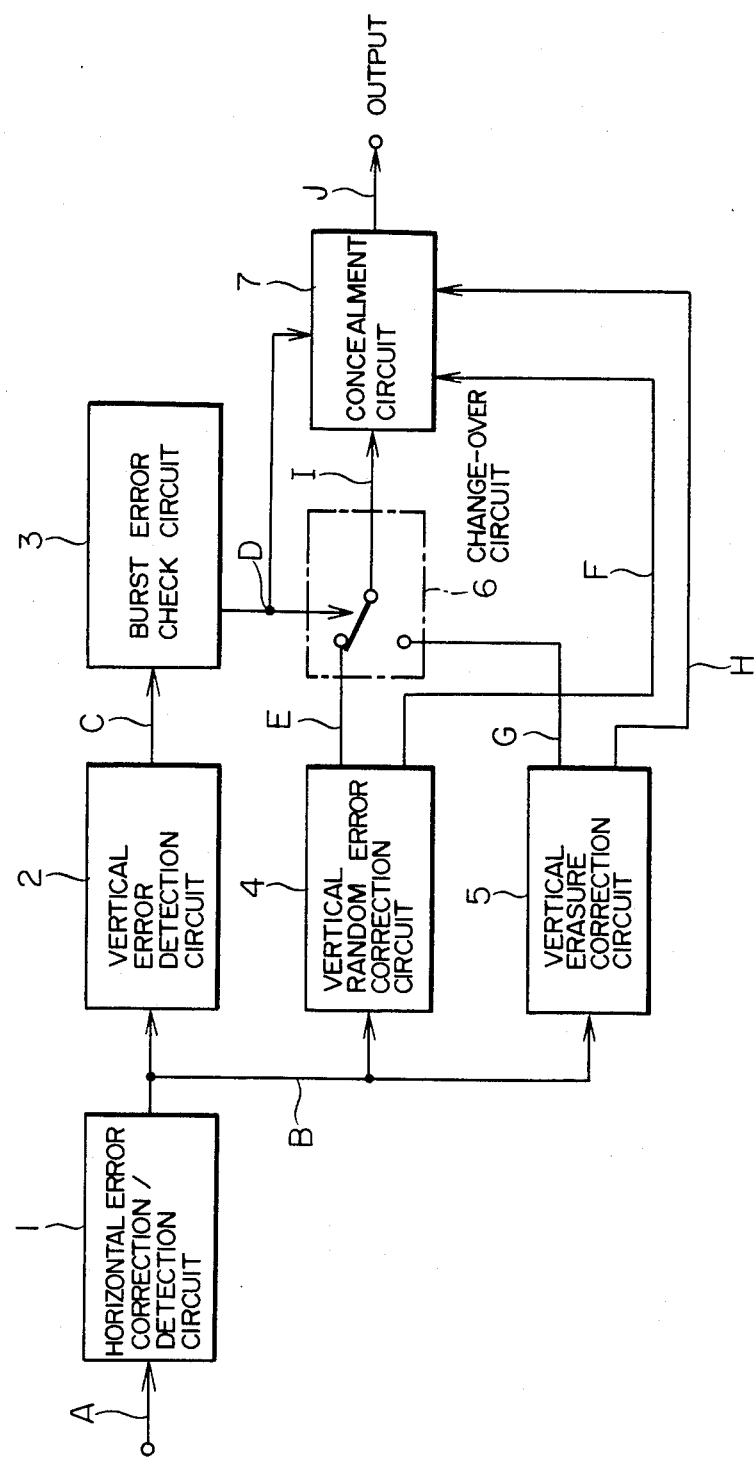
FIG. 2 is a schematic circuit block diagram illustrating the configuration of the embodiment of FIG. 1.

FIG. 2 is a schematic circuit block diagram of an embodiment of the present invention. In this block diagram, a reproduction data A is first inputted to a horizontal error correction/detection circuit 1, which corrects and/or detects errors in the data A. In a case of data configuration of FIG. 4, an error is detected in the horizontal direction or a 1-symbol error correction is achieved. An output data B from the horizontal error correction/detection circuit 1 is inputted to a vertical error detection circuit 2, a vertical random error correction circuit 4, and a vertical erasure correction circuit 5.

The vertical error detection circuit 2 effects an error detection by use of the vertical parity. If an error is detected, a number C of a symbol or a column in which an error has occurred is outputted to the burst error check circuit 3. The burst error check circuit 3 determines whether or not the column positions of the columns associated with the detected errors are successive and outputs a correction mode change-over signal D to the change-over circuit 6. The vertical random error correction circuit 4 corrects a 1-symbol error in the vertical direction and outputs an output data E; moreover, if an error exceeding the correction capability occurs, an error flag F is outputted to a concealment circuit 7. In addition, the vertical erasure correction circuit 5 executes an erasure correction for any error including at most two erroneous symbols in the vertical direction by use of the output data B from the horizontal error correction/detection circuit 1 and outputs an output G; furthermore, for an error exceeding the correction capability, an error flag H is outputted to the concealment circuit 7.

The change-over circuit 6 selects the output data E after the vertical 1-symbol error correction or the output data G after the vertical erasure correction depending on the correction mode change-over signal D and outputs an output data I. Moreover, the concealment circuit 7 changes the symbols determined to be uncorrectable by these correcting circuits to the symbols having a correlation and outputs a final output data J.

Figure 3:
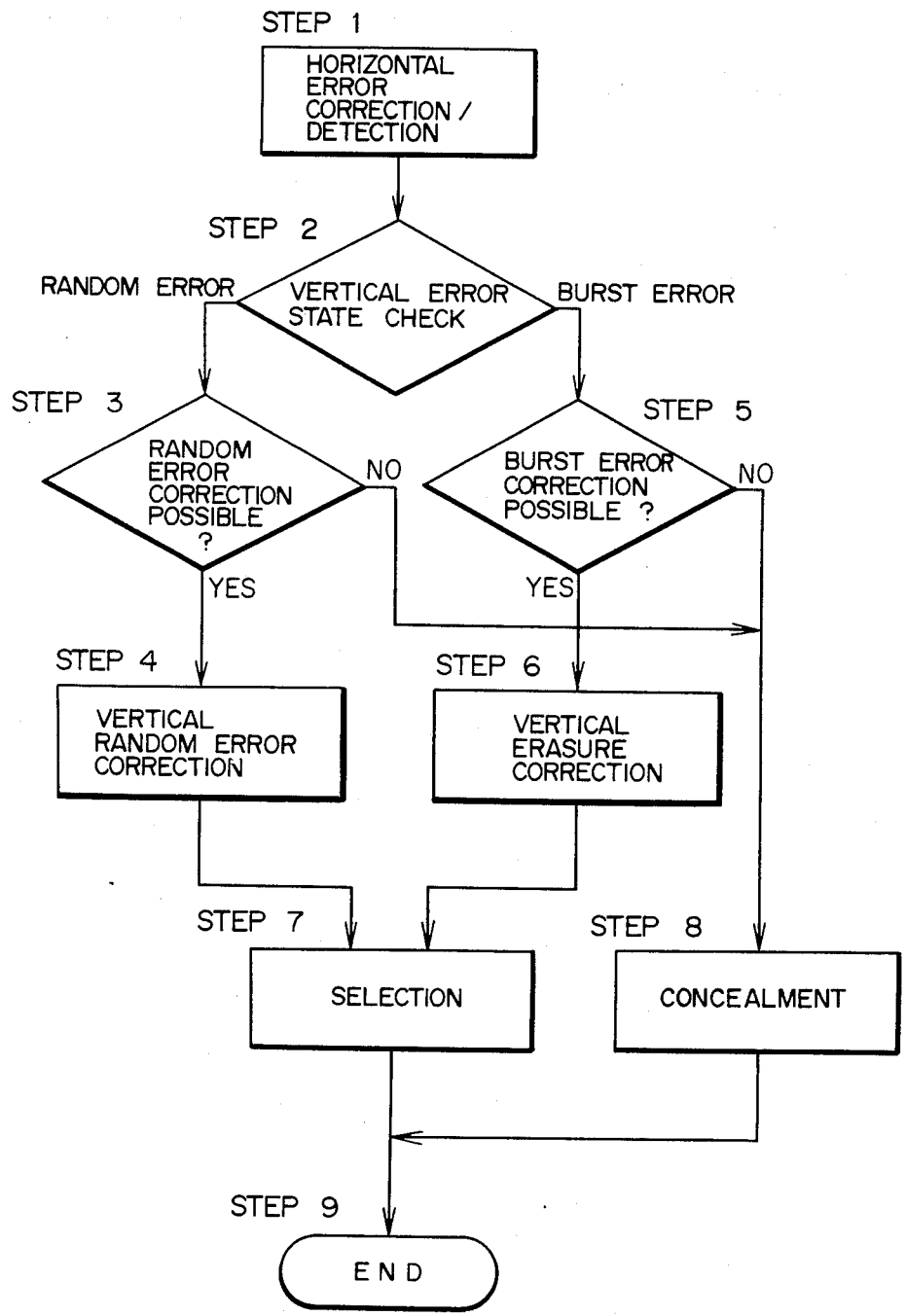
FIG. 3 is a flowchart demonstrating a decoding algorithm of the embodiment.
Figure 7A:
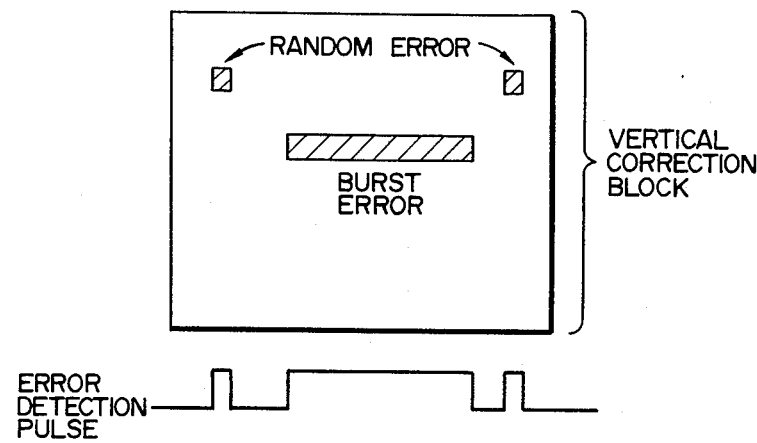
FIGS. 7A–7B are explanatory diagrams for explaining the burst error detecting system.
Figure 7B:
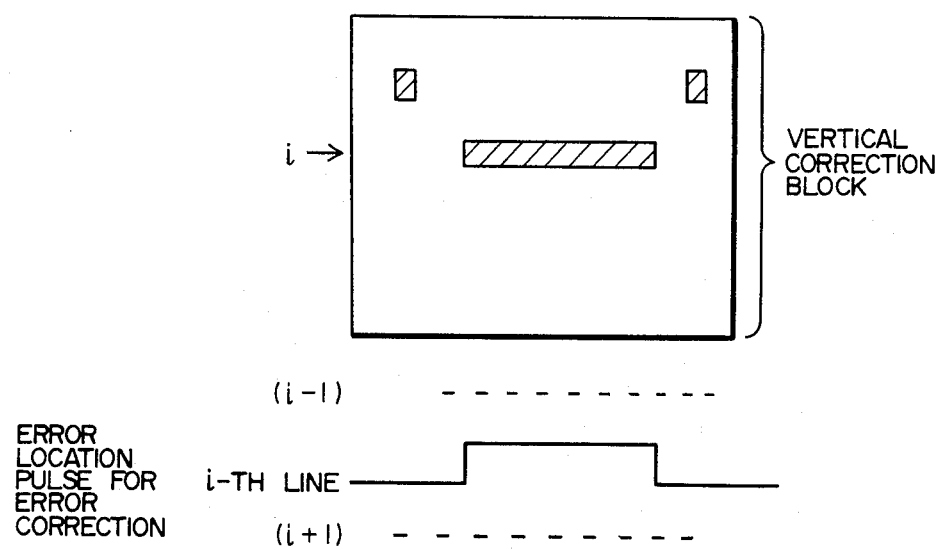

FIG. 3 is a flowchart of the decoding algorithm of the embodiment. After a horizontal error is corrected or detected (step 1), a vertical error is detected by use of the vertical parity, and the error state is checked against a random or burst error (step 2). For a determination criterion, a burst error may be determined to have occurred, for example, if an error has successively occurred in the vertical direction (along the column), namely, the column numbers of the columns associated with the detected errors are successive (FIG. 7A). In addition, to improve the accuracy for detecting the burst error, it is only necessary to accomplish a 1-symbol random error correction in the vertical direction and to detect whether or not the positions of the detected errors are successive in the horizontal direction (FIG. 7B). FIGS. 7A–7B are schematic diagrams showing the vertical correction data in the cases where random and burst errors occur at the same time. In either system, the portion in which the burst error has occurred can be specified.

Now, getting back to FIG. 3, if a burst error is assumed as a result of the vertical error state check in step 2, a burst error detection is effected; otherwise, a random error correction is performed. Before conducting the error corrections, the system checks whether or not the correction is possible (steps 3 and 5). If the correction is found to be impossible, a correlated image data (for example, an image data of the preceding field) is substituted for the error symbols (step 8). If the correction is possible, the random error correction is executed in the vertical direction (step 4) or the erasure correction is achieved in the vertical direction (step 6). After the selection is performed between these corrections (step 7), an output operation is executed.

For the condition to determine the burst error, a change in the envelope of the reproduction signal and other analog information may be utilized, for example.

Figure 4:
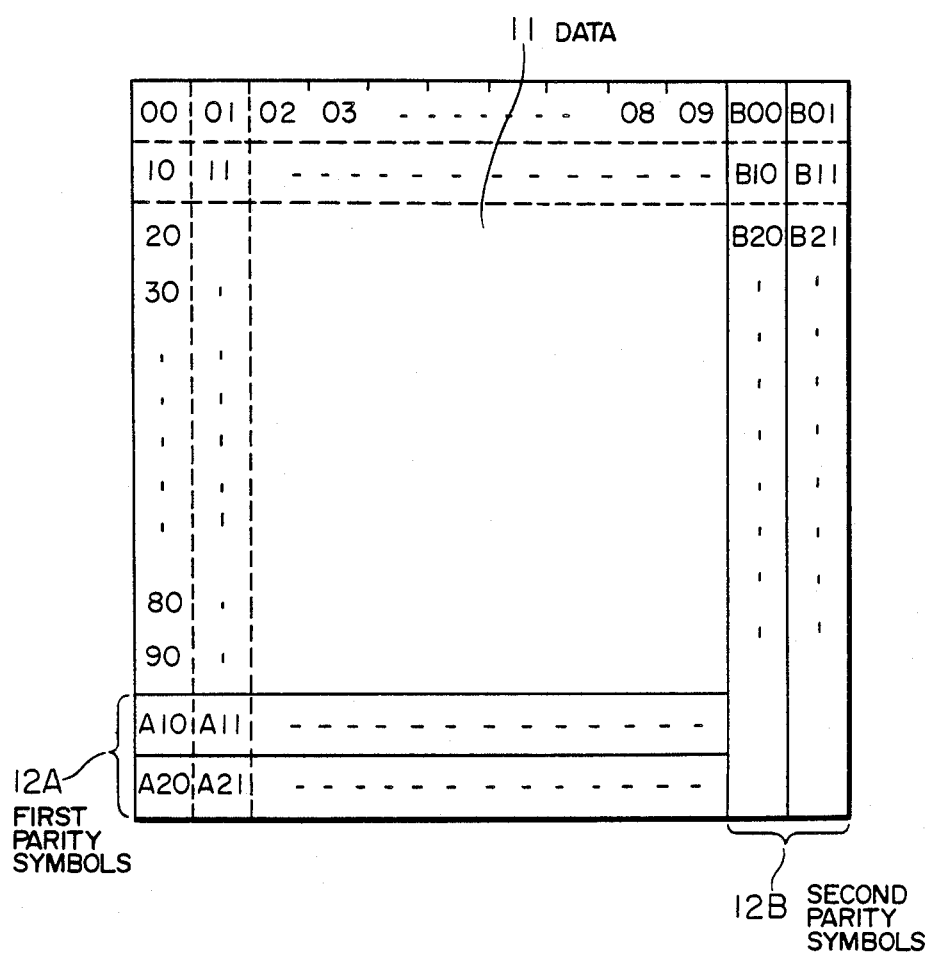
FIG. 4 is an explanatory diagram depicting an example of the double-encoding code configuration.
Figure 5:
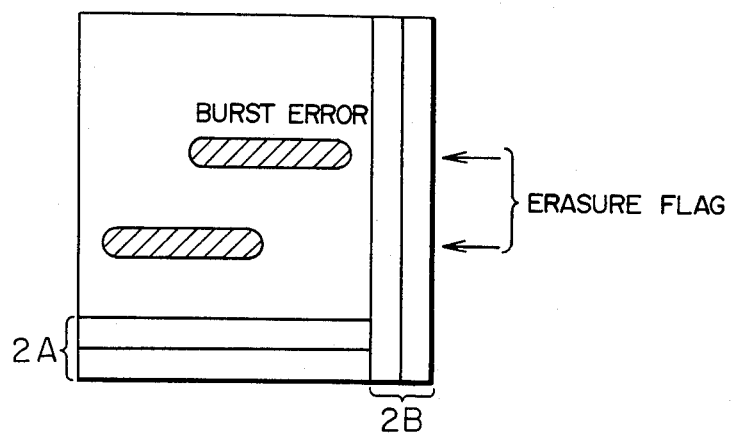
FIG. 5 is an explanatory diagram illustrating a burst error occurrence.
Figure 6:
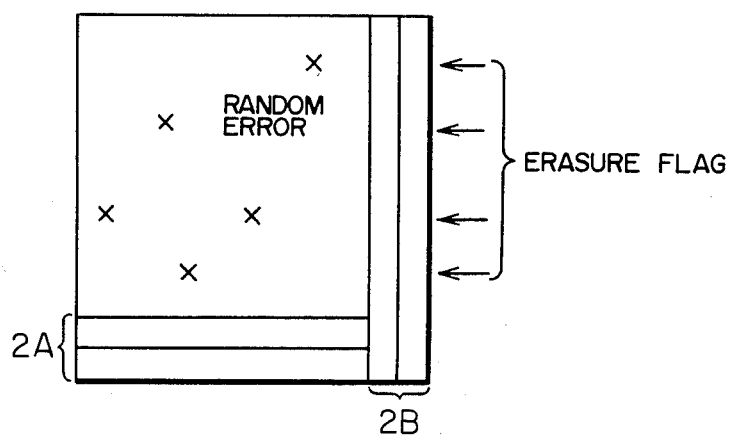
FIG. 6 is an explanatory diagram illustrating a random error occurrance.

Although the embodiment has been described with reference to a case of the code configuration of FIG. 4, the double-encoding code system is not restricted by the code configuration of FIG. 4 but the configurations of the concatenated codes and the product codes may also be applicable. The utilization codes are not limited to the Reed-Solomon codes. In addition, since the code correction capability is increased when the number of parity symbols is two or more, various correcting systems may be correspondingly combined for the code correction.

According to the present invention, when reproducing data having the code configuration in the double-encoding code system, the code error state is checked to determine whether the state indicates a burst error or a random error and then optimum decoding system can be selected depending on the result of the check. Consequently, an error correction can be effectively achieved even in a case where the burst and random errors occur at the same time.

We claim:

1. A code error method for correcting errors in first and second error detection and/or error correction code words, said first error detection and/or error correction code words comprising a plurality of digital symbols in a first arrangement state and first parity symbols thereof and said second error detection and/or error correction code words including a plurality of digital symbols in a second arrangement state including symbols of said first error detection and/or error correction code words and second parity symbols thereof, comprising the steps of:

effecting an error detection or an error correction by use of said second parity symbols; and determining thereafter by use of said first parity symbols whether or not errors included in said first error detection and/or correction code words occur successively and changing over, based on the outcome of the determination, to a first one of at least two types of error correcting systems if errors in said first error detection and/or error correction code words were determined to occur successively or to a second of said at least two types of error correcting systems if errors in said first error detecting and/or error correction code words were determined not to occur successively.

2. A method according to claim 1, wherein said first of said at least two types of error correcting systems of said first error detecting and/or error correcting code words is an erasure correcting system.

3. A method according to claim 1 wherein said two types of error correcting systems are a random error correcting system and an erasure correcting system.

4. A method according to claim 1, wherein said step of changing over further comprises:

changing over to an erasure correcting system when it is determined that errors in said first error detection and/or error correction code words occur successively, and changing over to a random error correcting system when it is determined that errors in said first error detection and/or correction code words occur randomly.

5. A method according to claim 4, wherein said plurality of digital symbols in said first and second arrangements corresponds to vertical columns and horizontal rows of a double-encoding code system, respectively, and wherein said random error correcting system is a vertical random error correction circuit and said erasure correcting system is a vertical erasure correction circuit.

* * * * *